United States Patent
Beck et al.

(10) Patent No.: US 6,723,591 B2
(45) Date of Patent: Apr. 20, 2004

(54) ORGANIC LIGHT EMITTING DEVICES

(75) Inventors: Armin Beck, Au (CH); Tilman A. Beierlein, Kilchberg (CH); Peter Mueller, Zurich (CH); Heike Riel, Rueschlikon (CH); Walter Heinrich Riess, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/377,985

(22) Filed: Mar. 3, 2003

(65) Prior Publication Data

US 2003/0146453 A1 Aug. 7, 2003

Related U.S. Application Data

(62) Division of application No. 09/887,779, filed on Jun. 22, 2001, now Pat. No. 6,552,364.

(51) Int. Cl.[7] .................. H01L 21/336; H01L 21/8238
(52) U.S. Cl. ........................................ 438/197; 438/463
(58) Field of Search ............................ 438/22, 30, 197, 438/237, 463, 792

(56) References Cited

U.S. PATENT DOCUMENTS

| 5,705,285 | A | 1/1998 | Shi et al. ..................... 428/690 |
| 5,986,400 | A | 11/1999 | Staring et al. ............... 313/503 |
| 6,137,221 | A | 10/2000 | Roitman et al. ............. 313/504 |
| 6,297,516 | B1 | 10/2001 | Forrester et al. .............. 257/40 |
| 6,552,364 | B2 * | 4/2003 | Beck et al. ..................... 257/79 |

* cited by examiner

*Primary Examiner*—David Nhu
(74) *Attorney, Agent, or Firm*—Ohlandt, Greeley, Ruggiero & Perle, L.L.P.; Robert M. Trepp

(57) ABSTRACT

There is provided a method for fabricating an organic light emitting device. The method includes depositing a first electrode layer on a substrate, depositing an electrically insulating layer on the first electrode layer, depositing a second electrode layer on the insulating layer, depositing an organic layer on the second electrode layer, forming an aperture in the organic layer, depositing a light transmissive electrically conductive layer on the organic layer, and forming an electrical connection between the conductive layer and one of the first and second electrode layers via the aperture.

11 Claims, 5 Drawing Sheets

ORGANIC LIGHT EMITTING DEVICES

The present application is a divisional of U.S. patent application Ser. No. 09/887,779, filed Jun. 22, 2001 now U.S. Pat. No. 6,552,364.

BACKGROUND OF THE INVENTION (a) Field of the Invention

The present invention relates to organic light emitting devices for display applications and to methods for fabricating such devices.

(b) Background Art

Organic light-emitting devices (OLEDs) are typically manufactured as a sequence of layers deposited on top of each other to form a layer structure. The layer structure typically comprises a first electrode on a supporting substrate and several organic layers disposed between the first electrode and a second electrode. Light output is generated by charge injection into the organic material via the electrodes. The organic material emits photons on excitation by the injected charge. At least one of the electrodes is typically formed from a light transmissive material such as Indium Tin Oxide (ITO) or a thin metal to permit passage of light out of the device.

SUMMARY OF THE INVENTION

In accordance with the present invention, there is now provided an organic light emitting device having a layer structure comprising: a first electrode layer; a second electrode layer parallel to the first electrode layer; an electrically conductive and light transmissive layer parallel to the second electrode layer; an electrically insulating layer disposed between the first and second electrode layers; a layer of organic material disposed between the second electrode layer and the conductive layer; an aperture in the organic layer providing an electrical connection path between the conductive layer and one of the first and second electrode layers.

Preferably, the first electrode layer, the second electrode layer, the insulating layer, and the conductive layer each comprise an array of parallel strips, the strip of the first electrode layer extending orthogonal to the strips of the second electrode layer. The strips of the insulating layer and the conductive layer may extend orthogonal to the strips of the first electrode layer. Alternatively, the strips of the insulating layer and the conductive layer may extend orthogonal to the strips of the second electrode layer.

In preferred embodiments of the present invention, there is provided a plurality of apertures in the organic layer each communicating with one of the first and second electrode layers. Each aperture may be located at a different intersection of a strip of the first electrode layer and a strip of the second electrode layer. Each aperture may extend in a direction parallel to the strips of the second electrode layer. Alternatively, each aperture may extend in a direction parallel to the strips of the first electrode layer.

The strips of the conductive layer may be electrically connected to corresponding strips of the second electrode layer. Alternatively, the strips of the conductive layer may be electrically connected to corresponding strips of the first electrode layer.

Viewing the present invention from another aspect, there is now provided a method for fabricating an organic light emitting device, the method comprising: depositing a first electrode layer on a substrate; depositing an electrically insulating layer on the first electrode layer; depositing a second electrode layer on the insulating layer; depositing an organic layer on the second electrode layer; forming an aperture in the organic layer; depositing a light transmissive electrically conductive layer on the organic layer; and forming an electrical connection between the conductive layer and one of the first and second electrode layers via the aperture.

In a preferred embodiment of the present invention to be described shortly, there is provided a passive matrix OLED comprising a substrate on which is disposed a first electrode layer comprising an array of parallel strips. An insulating layer is disposed on the first electrode layer. The insulating layer also comprises an array of parallel strips. The strips of the insulating layer extend in a direction which is orthogonal to the strips of the first electrode layer. A second electrode layer is disposed on the insulating layer. The second electrode layer also comprises an array of parallel strips running orthogonal to the strips of the first electrode layer. The strips of the second electrode layer overlay the insulating layer. The first electrode layer is thus electrically isolated from the second electrode layer by the insulating layer. An layer of organic material is disposed on the second electrode layer. The organic layer extends homogeneously across the strips of the second electrode layer, the first electrode layer, and the intervening insulating layer. Apertures are formed in the organic layer. The apertures communicate with the underlying second electrode layer. The organic layer is covered with a light transmissive, electrically conductive layer. Electrical contacts between the strips of the second electrode layer and the conducting layer are formed via the apertures in the organic layer. The conducting layer comprises an array of parallel strips running parallel to the strips of the second electrode layer. A partition runs between adjacent strips of the conductive layer. The OLED is thus divided into a matrix of addressable light emitting picture elements.

OLEDs embodying the present invention are advantageous in that the first and second electrodes need not be fabricated from a transparent conductor such as Indium Tin Oxide. Instead, the first and second electrode may be selected from a broader range of materials. The electrical characteristics of the first and second electrodes can thus be optimized in the interests of, for example, improving luminous efficiency and reducing potential drops across the display area. Such potential drops would otherwise impair the quality of the displayed image.

BRIEF DESCRIPTION OF THE DRAWINGS

Preferred embodiments of the present invention will now be described, by way of example only, with reference to the accompanying drawings, in which.

DETAILED DESCRIPTION OF A PREFERRED EMBODIMENT

What follows now is a description of a passive matrix OLED embodying the present invention and methods for fabricating such an OLED.

Figure 1:
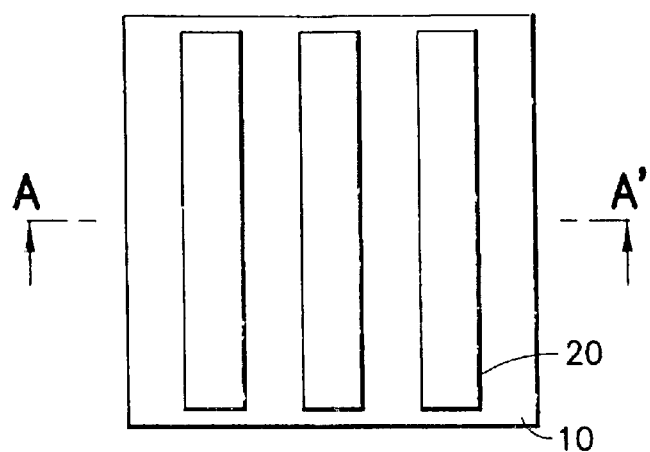
FIG. 1 is a plan view of a substrate with a first electrode layer disposed thereon.
Figure 2:
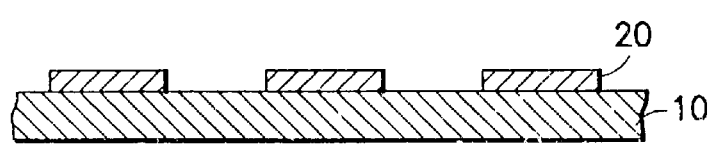
FIG. 2 is a cross-sectional view of the substrate of FIG. 1 in the plane A–A' when viewed in the direction of the arrows.

Referring first to FIGS. 1 and 2 in combination, in a preferred embodiment of the present invention, first electrode layer of electrically conducting material 20 is deposited on a substrate 10. The substrate 10 may be formed from a light transmissive material such as glass or plastics or from an opaque material such as a Silicon wafer. The first electrode layer 20 may be formed from a range of different materials, including but not limited to Indium Tin Oxide, Indium Zinc Oxide, Aluminum Zinc Oxide, Aluminum, Nickel, Copper, Platinum, and Iridium, or combinations of the aforementioned materials with organic and/or inorganic charge injection layers. The first electrode layer 20 comprises an array of parallel strips. In particularly preferred embodiments of the present invention, the strips of the first electrode layer 20 can be formed by evaporation and liftoff processes. The liftoff process typically involves applying a pattern of photo-resist to the substrate 10 prior to evaporation of the first electrode layer 20 onto the substrate 10 and then removing the portions of the first electrode layer 20 overlying the resist pattern. The evaporation process may be replaced by sputtering or electroless plating. The liftoff process may be replaced by wet or dry etching.

Figure 3:
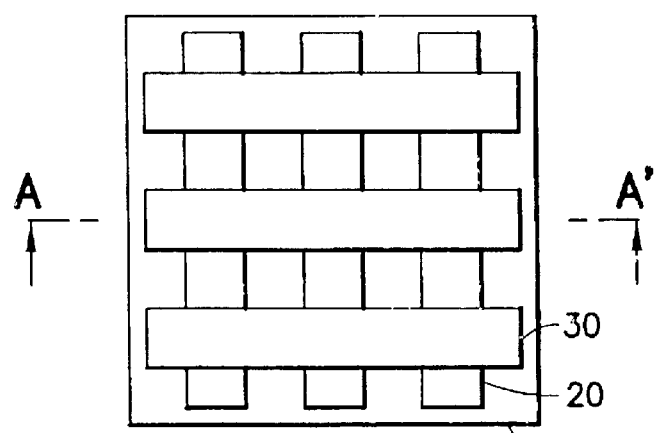
FIG. 3 is a plan view of the substrate with an insulating layer disposed on the first electrode.
Figure 4:
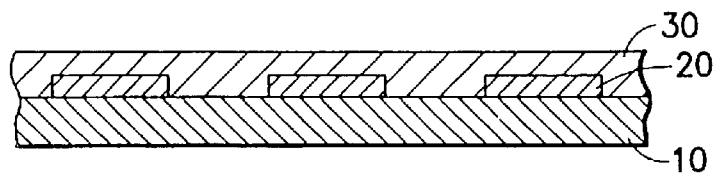
FIG. 4 is a cross-sectional view of the substrate of FIG. 3 in the plane A–A' when viewed in the direction of the arrows.

With reference now to FIGS. 3 and 4 in combination, an insulating layer 30 is then deposited on the first electrode layer 20. The insulating layer 30 may be formed from a range of materials including photo-resists, polymers, organic and inorganic insulators, Silicon oxide, Silicon Nitride, Tantalum Oxide, together with other Oxides, Nitrides, and Fluorides. The insulating layer 30 also comprises an array of parallel strips. The strips of the insulating layer 30 extend in a direction which is orthogonal to the strips of the first electrode layer 20. In particularly preferred embodiments of the present invention, the strips of the insulating layer 30 are formed by deposition and liftoff processes. Wet or dry etching may be employed by way of alternative to the liftoff process.

Figure 5:
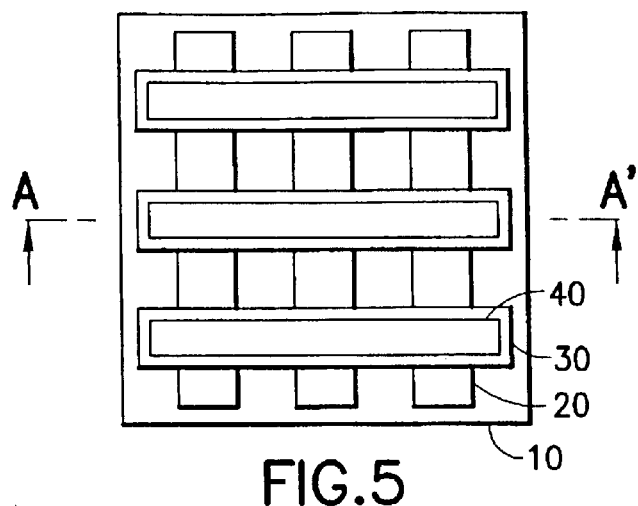
FIG. 5 is a plan view of the substrate with a second electrode layer disposed on the insulating layer.
Figure 6:
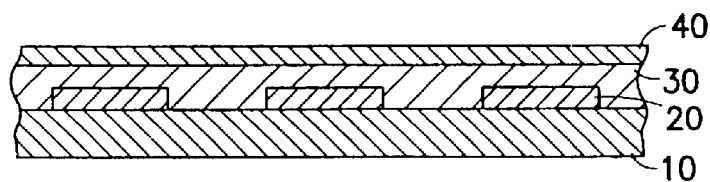
FIG. 6 is a cross-sectional view of the substrate of FIG. 5 in the plane A–A' when viewed in the direction of the arrows.

Turning now to FIGS. 5 and 6 in combination, a second electrode layer 40 is then deposited on the insulating layer 30. The second electrode layer 40 may be formed from a range different materials, including but not limited to transparent organic conductors, Indium Tin Oxide, Indium Zinc Oxide, Aluminum Zinc Oxide, Aluminum, Nickel, Copper, and Platinum-Iridium. The second electrode layer 40 also comprises an array of parallel strips running orthogonal to the strips of the first electrode layer 20. The strips of the second electrode layer 40 overlay the strips of the insulating layer 30. The first electrode layer 20 is thus electrically isolated from the second electrode layer 40 by the insulating layer 30. In particularly preferred embodiments of the present invention, the strips of the second electrode layer 40 may be formed by the aforementioned evaporation, sputtering, electroless plating, liftoff, wet etch and dry etch processes, or combinations thereof.

Figure 7:
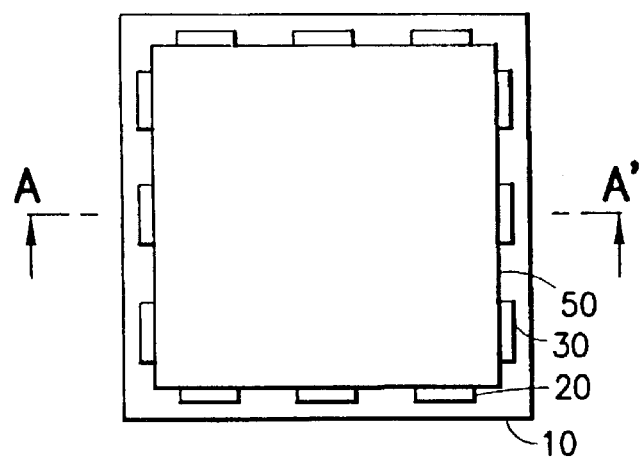
FIG. 7 is a plan view of the substrate with an organic layer disposed on the insulating layer.
Figure 8:
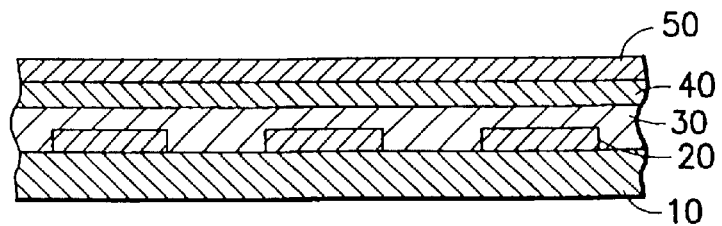
FIG. 8 is a cross-sectional view of the substrate of FIG. 7 in the plane A–A' when viewed in the direction of the arrows.

Referring now to FIGS. 7 and 8 in combination, a layer of organic material 50 is then deposited on the second electrode layer 40. The organic layer 50 comprises active components which are emissive of light when electrically stimulated. These active components may be relatively small organic molecules or organic polymers such as a poly(phenylene vinylene). The organic layer 50 extends homogeneously across the strips of the second electrode layer 40, the first electrode layer 20, and the intervening insulating layer 30. The organic layer 50 may comprise a single layer of organic material. However, in particularly preferred embodiments of the present invention, the organic layer 50 comprises a composite organic layer including a stack of organic layers. In preferred embodiments of the present invention, the organic layer 50 is deposited on the second electrode layer 40 by thermal evaporation.

Figure 9:
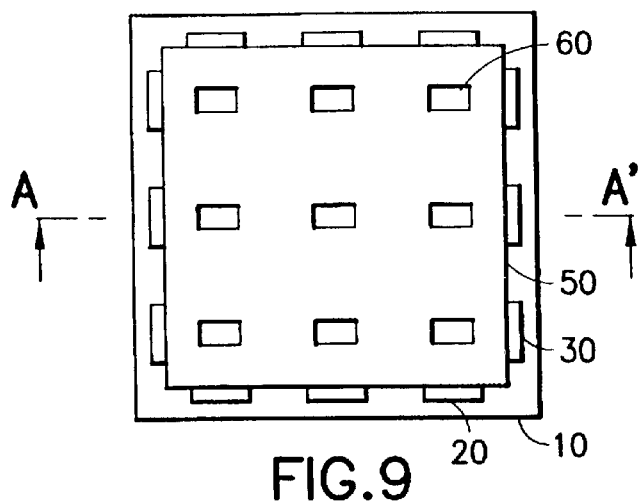
FIG. 9 is a plan view of the substrate with apertures formed in the organic layer.
Figure 10:
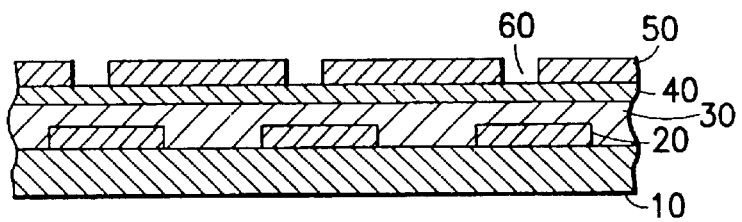
FIG. 10 is a cross-sectional view of the substrate of FIG. 9 in the plane A–A' when viewed in the direction of the arrows.

With reference to FIGS. 9 and 10 in combination, apertures 60 are then formed in the organic layer 50 at each intersection of the strips of the first electrode layer 20 and the strips of the second electrode layer 40. The apertures 60 communicate with the underlying second electrode layer 40.

Figure 11:
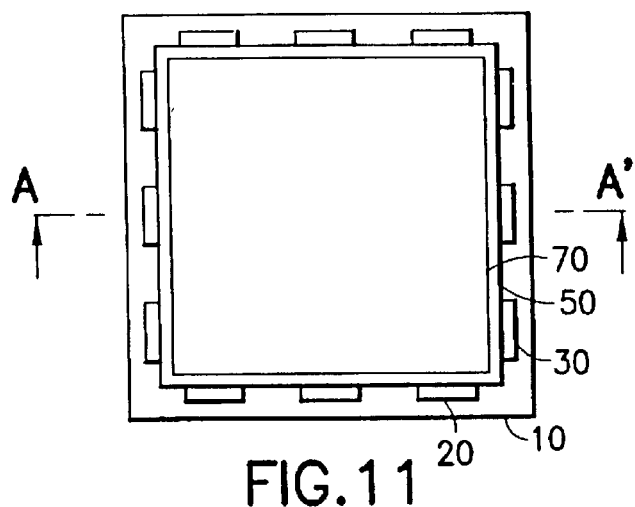
FIG. 11 is a plan view of the substrate with an electrically conducting layer disposed on the organic layer.
Figure 12:
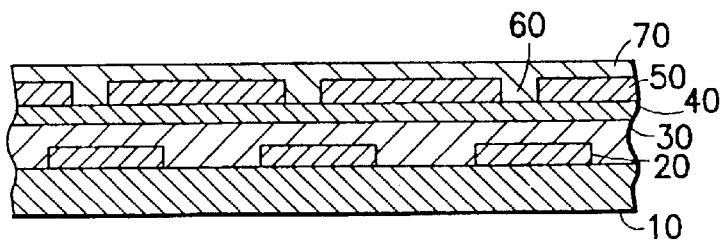
FIG. 12 is a cross-sectional view of the substrate of FIG. 11 in the plane A–A' when viewed in the direction of the arrows.

Referring now to FIGS. 11 and 12 in combination, the organic layer 50 is then covered with a light transmissive, electrically conductive layer 70. The conductive layer 70 may be formed from a range of materials, including but not limited to organic conductors such as polyaniline, polythiophene and derivatives thereof, and Indium Tin Oxide and semi transparent metals, for example. Electrical contacts between the strips of the second electrode layer 40 and the conductive layer 70 are formed via the apertures 60 in the organic layer 50.

Figure 13:
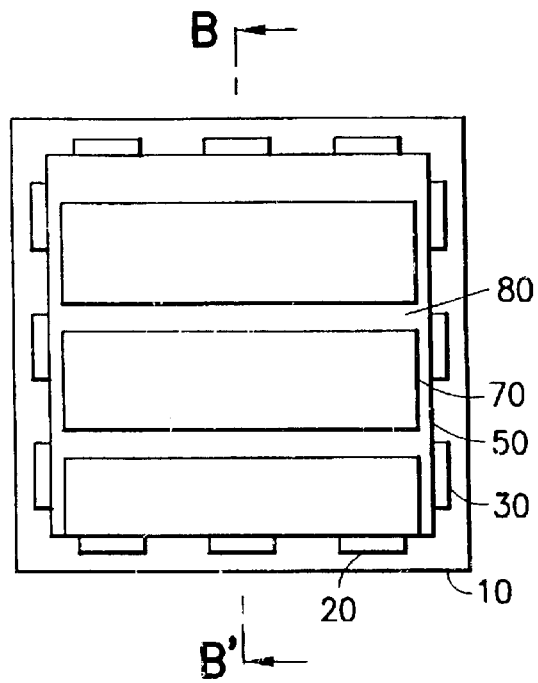
FIG. 13 is a plan view of the substrate with the conducting layer shaped to provide discrete emission areas.
Figure 14:
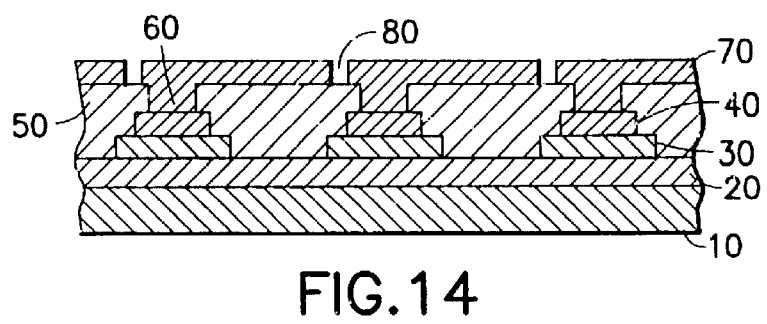
FIG. 14 is a cross-sectional view of the substrate of FIG. 13 in the plane B–B' when viewed in the direction of the arrows.

With reference to FIGS. 13 and 14 in combination, the conductive layer 70 is partitioned into parallel strips each connected to the underlying strip of the second electrode layer 40. A partition 80 runs between adjacent strips of the conductive layer 80. The OLED is thus divided into a matrix of addressable light emitting picture elements 90.

In particularly preferred embodiments of the present invention, the apertures 60 are formed by localized laser ablation of the organic layer 50. In particularly preferred embodiments of the present invention, the conductive layer 70 is deposited on the organic layer 50 by evaporation. The conductive layer 70 is then partitioned into strips by laser ablation. Alternatively, the apertures 60 may be formed by applying stripes of photo-resist having negative edges to the second electrode layer 40 and then depositing the organic layer 50 and conductive layer 70 using different evaporation angles. Such shadowing effects, together with dry liftoff or stamping may also be employed to partition the conductive layer 70. Stamping may also be used to create the apertures 60.

Figure 15:
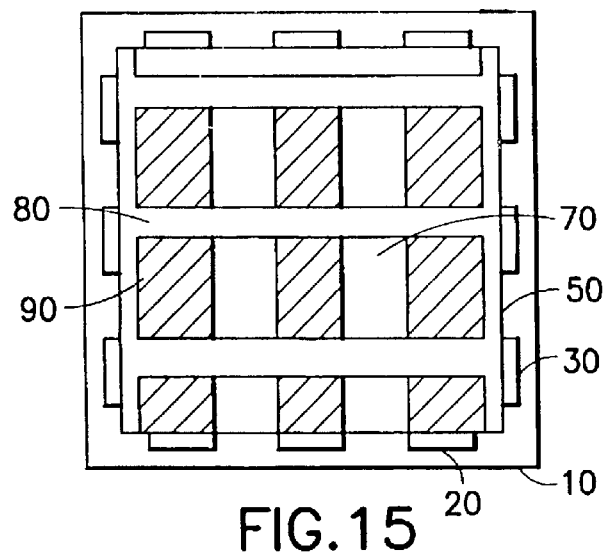
FIG. 15 is a modification of the plan view of FIG. 14 showing the display areas.

Remaining with FIGS. 14 and 15, a preferred example of an OLED embodying the present invention comprises a substrate 10 on which is disposed a first electrode layer 20 comprising an array of parallel strips.

An insulating layer 30 is disposed on the first electrode layer. The first electrode layer 20 is thus disposed between the substrate 10 and the insulating layer 30. The insulating layer 30 also comprises an array of parallel strips. The strips of the insulating layer 30 extend in a direction which is orthogonal to the strips of the first electrode layer 20.

A second electrode layer 40 is disposed on the insulating layer 30. The insulating layer 30 is thus disposed between the first electrode layer 20 and the second electrode layer 40. The second electrode layer 30 also comprises an array of parallel strips running orthogonal to the strips of the first electrode layer 20. The strips of the second electrode layer 40 overlay the insulating layer 30. The first electrode layer 20 is thus electrically isolated from the second electrode layer 40 by the insulating layer 30.

A layer of organic material 50 is disposed on the second electrode layer 40. The second electrode layer 40 is thus disposed between the organic layer 50 and the insulting layer 30. The organic layer 50 extends homogeneously across the strips of the second electrode layer 40, the strips of the first electrode layer 20, and the intervening insulating layer 30.

Apertures 60 are provided in the organic layer 50 at each intersection of the strips of the first electrode layer 20 and the strips of the second electrode layer 40. The apertures 60 communicate with the underlying second electrode layer 40. The organic layer 50 is covered with an electrically conductive layer 70. The organic layer 50 is thus disposed between the conductive layer 70 and the second electrode layer 40. Electrical contacts between the strips of the second electrode layer 40 and the conducting layer 70 are formed via the apertures 60 in the organic layer 50. The conducting layer 70 comprises an array parallel strips running parallel to the strips of the first electrode layer 20. A partition 80 runs between adjacent strips of the conductive layer 80. The OLED is thus divided into a matrix of light emitting picture elements 90.

Each element 90 corresponds to a different intersection of the strips of the first electrode layer 20 and the strips of the second electrode layer 40. Thus, each element 90 can be addressed via a different combination of a strip of the first electrode layer 20 and a strip of the second electrode layer 40. Each element 90 is stimulated to emit light by applying a potential difference between the corresponding strip of the first electrode layer 20 and the corresponding strip of the second layer 40. One of the first and second electrode layers serves as an anode while the other serves as a cathode depending of the direction of application of the potential difference.

Figure 16:
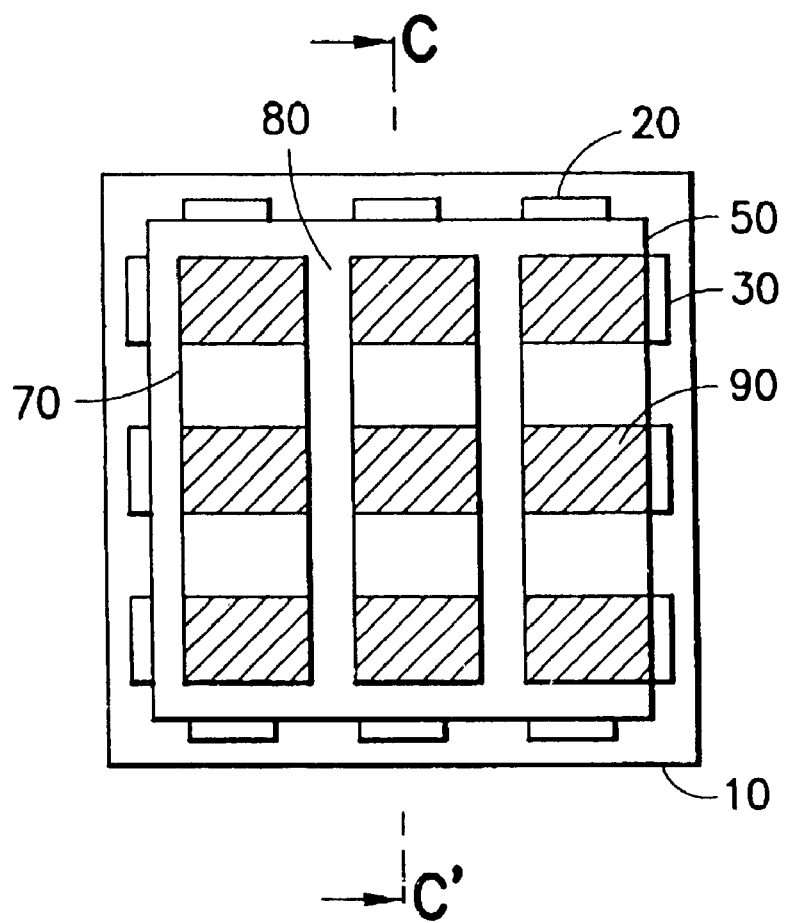
FIG. 16 is a is a plan view of another example of an OLED embodying the present invention; and, FIG. 17 is a cross-sectional view of the OLED of FIG. 13 in the plane C–C' when viewed in the direction of the arrows.
Figure 17:
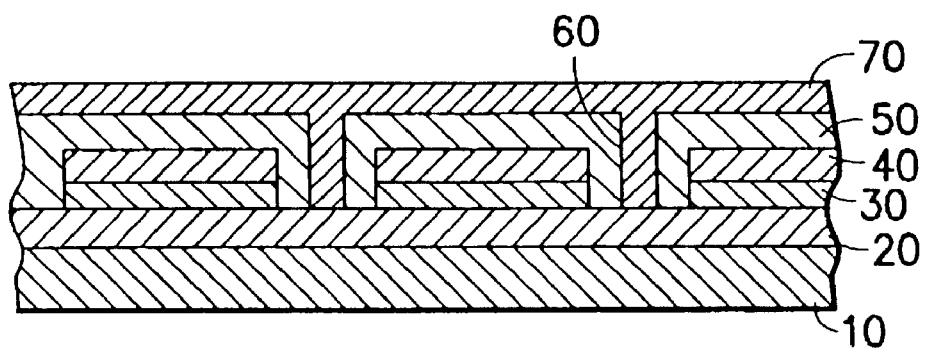

Referring now to FIGS. 16 and 17 in combination, in a modification of the OLED hereinbefore described with reference to FIG. 14, the apertures 60 communicate between the conductive layer 70 and the first electrode layer 20 through the organic layer 50. The first electrode layer 20 is again partitioned into strips. Electrical contacts between the strips of the first electrode layer 20 and the conductive layer 70 are formed via the apertures 60. However, the strips of the conductive layer 70 now run parallel to the strips of the first electrode layer 20. The OLED is thus also divided into a matrix of light emitting picture elements 90.

Several OLEDs embodying the present invention may be fabricated on a common substrate 10 and combined to produce larger area, higher resolution display panel. Electrically conductive paths may be provided in the substrate, or on the back face thereof, to facilitate the interconnection of addressing and synchronization circuitry of adjacent OLEDs in the display panel. Because the OLEDs are fabricated on a common substrate during the same deposition process, the characteristics of each OLED is uniform. Additionally, problems with aligning of the OLEDs relative to each other are avoided.

In the embodiments of the present invention hereinbefore described, the conductive layer 70 is partitioned into an array of strips running in a direction parallel to the strips of one of the first 20 and second 40 electrode layers. However, it will be appreciated that, in other embodiments of the present invention, the conductive layer 70 may be partitioned in both the direction of the strips of the first electrode layer 20 and the direction of the strips of the second electrode layer 40, thereby producing an array of conductive pads each corresponding to a different picture element 90 of the display and each connected to underlying strip of one of the first 20 and second 40 electrode layers.

What is claimed is:

1. A method for fabricating an organic light emitting device, the method comprising:

depositing a first electrode layer on a substrate;

depositing an electrically insulating layer on said first electrode layer;

depositing a second electrode layer on said insulating layer;

depositing an organic layer on said second electrode layer;

forming an aperture in said organic layer;

depositing a light transmissive electrically conductive layer on said organic layer; and forming an electrical connection between said conductive layer and one of said first and second electrode layers via said aperture.

2. The method of claim 1, wherein said first electrode layer, said second electrode layer, said insulating layer, and said conductive layer each comprise an array of parallel strips, said strip of said first electrode layer extending orthogonal to said strips of said second electrode layer.

3. The method of claim 2, wherein said strips of said insulating layer and said conductive layer extend orthogonal to said strips of said first electrode layer.

4. The method of claim 2, wherein said strips of said insulating layer and said conductive layer extend orthogonal to said strips of said second electrode layer.

5. The method of claim 2, wherein said organic layer includes a plurality of apertures each communicating with one of said first and second electrode layers.

6. The method of claim 5, wherein each aperture is located at a different intersection of a strip of said first electrode layer and a strip of said second electrode layer.

7. The method of claim 5, wherein each aperture extends in a direction parallel to said strips of said second electrode layer.

8. The method of claim 5, wherein each aperture extends in a direction parallel to said strips of said first electrode layer.

9. The method of claim 3, wherein said strips of said conductive layer are electrically connected to corresponding strips of said second electrode layer.

10. The method of claim 4, wherein said strips of said conductive layer are electrically connected to corresponding strips of said first electrode layer.

11. The method of claim 1, wherein said layer structure is disposed on a substrate with said first electrode layer adjacent said substrate.

* * * * *